(12) United States Patent
Rattunde et al.

(10) Patent No.: US 8,263,489 B2
(45) Date of Patent: Sep. 11, 2012

(54) PROCESS FOR THE DEPOSITION OF AN ANTI-REFLECTION FILM ON A SUBSTRATE

(75) Inventors: Oliver Rattunde, Werdenberg (CH); Stephan Voser, Grabs (CH)

(73) Assignee: OC Oerlikon Balzers AG, Balzers (LI)

( * ) Notice: Subject to any disclaimer, the term of this patent is extended or adjusted under 35 U.S.C. 154(b) by 0 days.

(21) Appl. No.: 13/011,109

(22) Filed: Jan. 21, 2011

(65) Prior Publication Data

US 2011/0177649 A1  Jul. 21, 2011

Related U.S. Application Data

(60) Provisional application No. 61/296,948, filed on Jan. 21, 2010.

(51) Int. Cl.
*H01L 21/4763* (2006.01)
*H01L 31/0232* (2006.01)

(52) U.S. Cl. ........ 438/636; 438/791; 257/437; 257/640; 257/E21.293

(58) Field of Classification Search .............. 438/46–48, 438/636, 791
See application file for complete search history.

(56) References Cited

U.S. PATENT DOCUMENTS

| | | | | |
|---|---|---|---|---|
| 6,015,595 | A * | 1/2000 | Felts | 427/446 |
| 7,705,236 | B2 | 4/2010 | Ishikawa et al. | |
| 2001/0021422 | A1 * | 9/2001 | Yamakoshi et al. | 427/569 |
| 2003/0111012 | A1 | 6/2003 | Takeshima | |
| 2005/0120955 | A1 | 6/2005 | Yamasaki et al. | |
| 2007/0095387 | A1 * | 5/2007 | Fujii et al. | 136/251 |
| 2007/0212893 | A1 * | 9/2007 | McTeer | 438/758 |
| 2008/0302653 | A1 * | 12/2008 | Trassl et al. | 204/192.1 |
| 2009/0320755 | A1 * | 12/2009 | Liu et al. | 118/719 |
| 2010/0258169 | A1 * | 10/2010 | Sheng et al. | 136/255 |

FOREIGN PATENT DOCUMENTS

| | | |
|---|---|---|
| WO | 01/73151 A1 | 10/2001 |
| WO | 2008/080249 A2 | 7/2008 |
| WO | 2009/071667 A1 | 6/2009 |

OTHER PUBLICATIONS

Wolke, et al., "SIN:H Anti-Reflection Coatings for C-SI Solar Cells by Large Scale Inline Sputtering", Proceedings 19th European Photovoltaic Solar Energy Conference, Paris, FR, (Jun. 2004).
International Search Report for PCT/IB2011/050235 dated May 16, 2011.

* cited by examiner

*Primary Examiner* — Hsien Ming Lee
(74) *Attorney, Agent, or Firm* — Pearne & Gordon LLP

(57) ABSTRACT

A method for the deposition of an anti-reflection film on a substrate is disclosed. A substrate including a plurality of solar cell structures is provided and placed in a vacuum chamber with a target including silicon. A flow of a nitrogen-containing reactive gas into the vacuum chamber is set to a first value while a voltage between the target and ground is switched off and then increased to a second value. A voltage is applied between the target and ground, whereby a film of silicon and nitrogen is deposited on the substrate in a flow of the nitrogen-containing reactive gas which is higher than the first value.

13 Claims, 8 Drawing Sheets

PROCESS FOR THE DEPOSITION OF AN ANTI-REFLECTION FILM ON A SUBSTRATE

BACKGROUND

This application relates to the production of anti-reflection films and, in particular, to the production of an anti-reflection film on a substrate such as a solar cell.

Solar cells are used to convert photons, typically those of sunlight, into electrical energy. Currently, however, the efficiency of this conversion process is not as high as is desired and further improvements are therefore desirable.

One approach to improving the conversion efficiency of a solar cell is to reduce the reflection of photons hitting the surface of the solar cell. This results in a higher percentage of photons penetrating the solar cell where they can be converted into electrical energy.

U.S. Pat. No. 7,705,236 B2 discloses solar cells which can comprise an anti-reflection film made of silicon nitride. The purpose of an anti-reflection coating of this type is to reduce reflection losses caused when sunlight hits the silicon surface of the solar cell. It also serves to prevent increased light absorption by the anti-reflection coating which, like reflection at the boundary, can lead to a reduction in the efficiency of the solar cell.

Further improvements are however desirable to further increase the reliability of the properties of the anti-reflection film and further improve the efficiency of the solar cell.

SUMMARY

A method for the deposition of a anti-reflection film on a substrate includes the following. A substrate including a plurality of solar cell structures is provided and placed in a vacuum chamber. The vacuum chamber includes a target which includes silicon. Whilst the voltage between the target and ground is switched off, a flow of a nitrogen-containing reactive gas in the vacuum chamber is set to a first value. The flow of the nitrogen-containing reactive gas is then increased to a second value and a voltage is applied between the target and ground, whereby a film comprising silicon and nitrogen is deposited on the substrate in a flow of the nitrogen-containing reactive gas which is greater than the first value.

DETAILED DESCRIPTION OF THE DRAWINGS

The text below describes embodiments involving the reactive sputtering of SiN using a target, made of silicon, and a reactive gas atmosphere with nitrogen or a nitrogen compound. However, the details given may apply to a large number of reactive processes for the deposition of, for example, oxide or nitride coatings from generally metal targets. In this context 'nitridic mode' is to be understood as a range with high reactive gas flow.

During film deposition in a reactive gas atmosphere it is determined that the partial pressure of the reactive gas may be a value determining inter alia deposition rate (on the substrate) and, for example, optical properties of the film.

During the PVD of SiN or SiN:H with a target of metallic silicon target and $N_2$ or, for example, $N_2+NH_3$ as the reactive gas, the sputtering voltage, i.e. the voltage of the power supply at a preset output, is an indicator of whether the process is in metallic or nitridic mode. On this point see FIG. 1 below which illustrates sputtering voltage as a function of the nitrogen flow at 55 sccm Ar flow. Here the sputtering process is in so-called 'metallic mode'.

Figure 1:
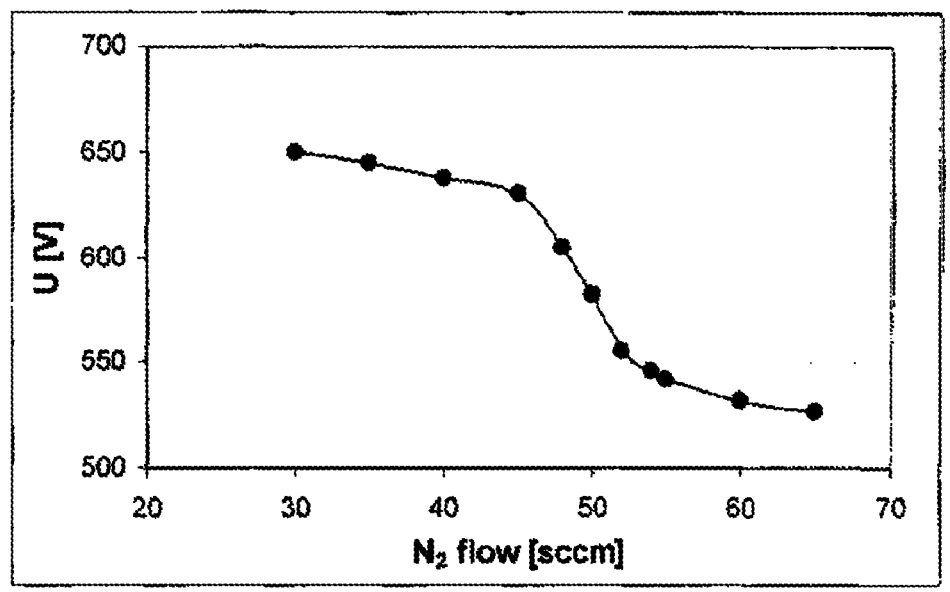
FIG. 1 illustrates a sputtering voltage represented as a function of nitrogen flow at 55 sccm Ar flow in general terms.

The 'metallic mode' occurs when a high voltage is observed at the target (to ground) and the nitrogen flow rate is low. 'Nitridic mode' occurs when a low voltage is observed and the nitrogen flow rate is high. The range around the turning point of the voltage curve illustrated in FIG. 1 is referred to as the 'transitional range'. The 'transitional range' is sensitive to small variations in process parameters resulting in changes in the properties of the deposited film.

Figure 2A:
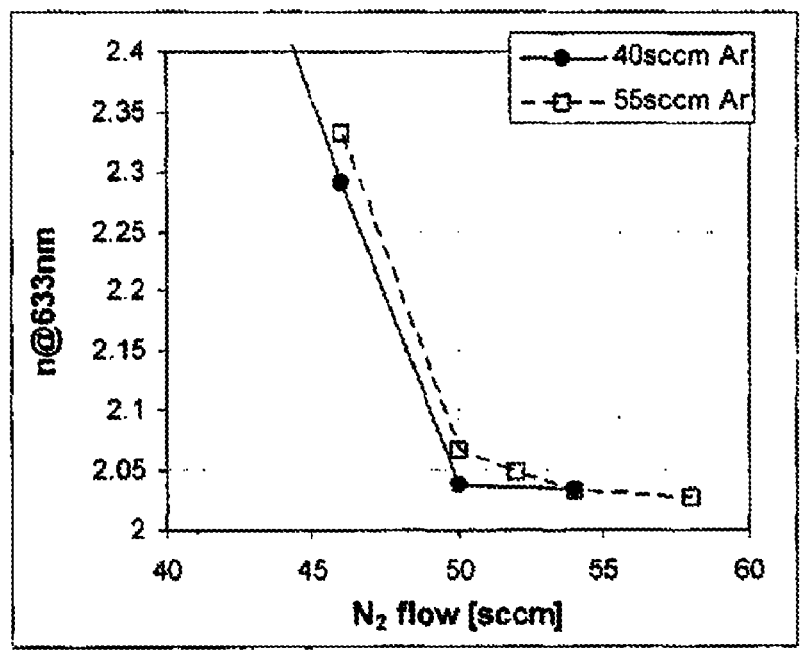
FIG. 2a illustrates the curve of the refractive index n at a wave length $\lambda=633$ as a function of $N_2$ flow in a transition range.
Figure 2B:
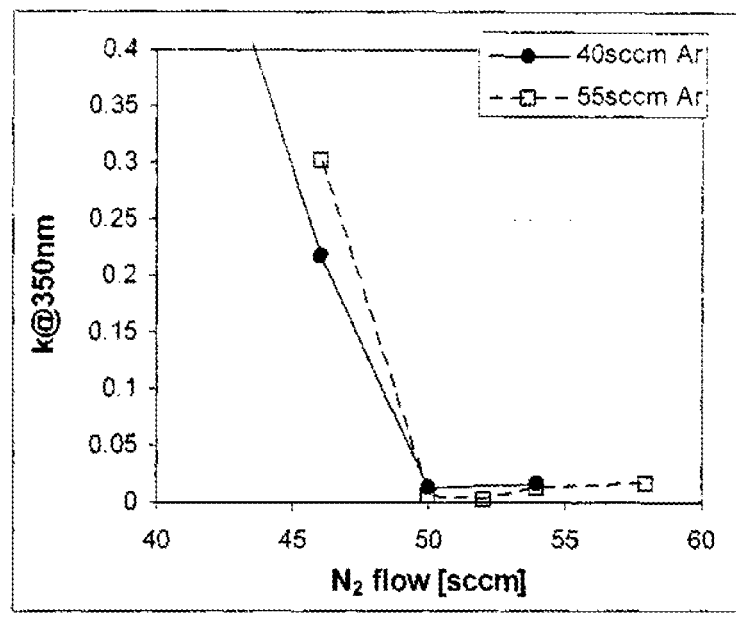
FIG. 2b illustrates the absorption coefficient k at $\lambda=350$ nm as a function of $N_2$ flow in a transition range.
Figure 2C:
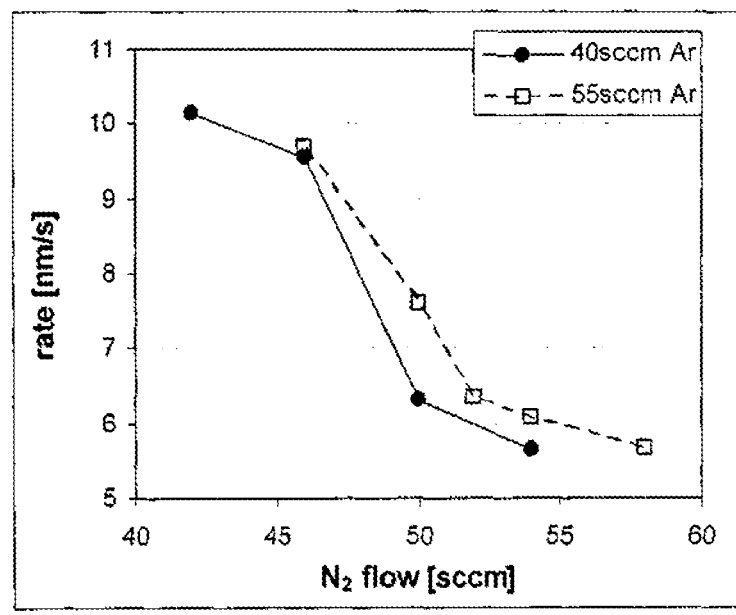
FIG. 2c illustrates the coating rate as a function of $N_2$ flow in a transition range.

The metallic mode is characterised by a high refractive index (n) value and higher absorption, in particular in the shortwave range of the visible spectrum, see FIGS. 2a to 2c.

For example, FIG. 2a illustrates the curve of the refractive index n at a wave length $\lambda=633$; FIG. 2b illustrates the absorption coefficient k at $\lambda=350$ nm; and FIG. 2c illustrates the coating rate as a function of the $N_2$ flow in the transition range. The 'sensitivity' of the process in the transition range is clear, particularly between 45 and 50 sccm $N_2$.

In diagrams 2a to 2c the continuous line illustrates an argon gas flow of 40 sccm and the broken line an argon gas flow of 55 sccm.

Since some of the reactive gas is incorporated into the film and thus consumed during the sputtering process, the partial pressure of the reactive gas when the plasma is switched on (power ON) is lower than that when the power is switched off, i.e the system in so-called idle status. When the plasma is switched on, this transition from high partial pressure without plasma to low partial pressure with plasma does not, however, take place instantaneously. Indeed it may take several seconds depending on the process and the system. This transitional range is referred to below as the 'start phase' of the reactive process.

Figure 3:
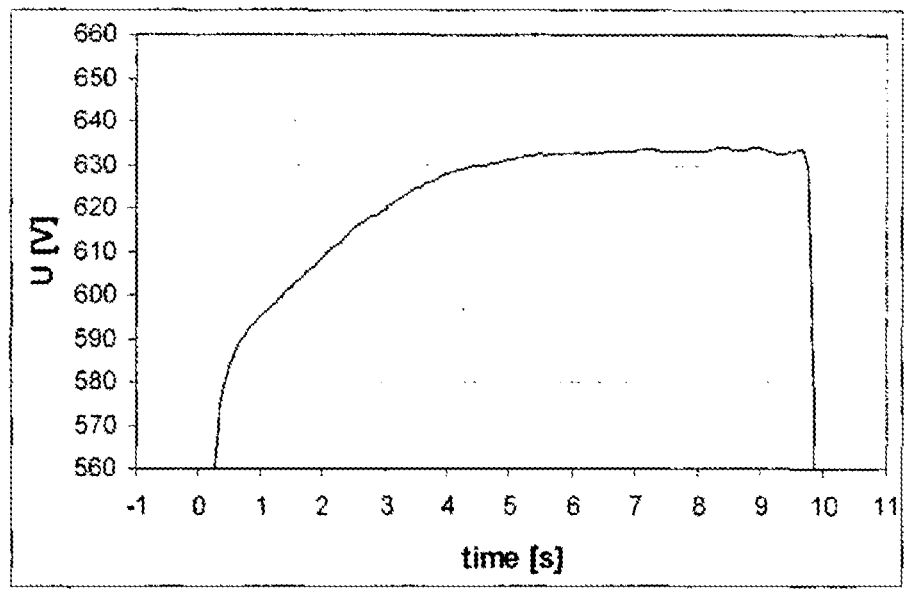
FIG. 3 illustrates the voltage curve during reactive sputtering of Si with 40 sccm Ar and 47.5 sccm $N_2$ observed during the course of the process over time.

The higher partial pressure of the reactive gas also results in other film properties in the start phase, e.g. lower refractive index, and, as illustrated by the results in FIG. 1, the process starts at a lower sputtering voltage, see FIG. 3. This effect is of course greater closer to the transition range where small changes in the reactive gas flow have the greatest effect. FIG. 3 illustrates the voltage curve during the reactive sputtering of Si with 40 sccm Ar and 47.5 sccm $N_2$ observed during the process over time near the transition range.

The higher partial pressure of the reactive gas during the start phase can result in non-homogenous film properties in the deposited film which are more significant the greater the length of the start phase in relation to the process time as a whole. In order to achieve a desired film property, e.g. a preset refractive index, with a short process time despite this fact, the gas flow of the reactive gas may be set such that the coating process ends more in metallic mode to compensate for the higher amount of reactive gas during the start phase. This compromise in process control may have a negative effect on the overall performance of the film system.

Furthermore, the film properties are also dependent on the process time since the relative percentage of the start phase, which can also be termed the nitridic mode, for shorter coating times increases, thereby giving a lower refractive index and a lower coating rate as illustrated in FIGS. 2a to 2c, for example. These inter-relationships make it complicated to adjust individual parameters, e.g. to adjust film thickness as is often required, as it is necessary to readjust a large number of process parameters.

In the case of SiN/SiN:H anti-reflection coatings for solar cells, in particular, although it is possible to set the desired effective refractive index by means of the process control compromise described above, the absorption of a gradient film of this type is higher as films have significantly higher absorption in metallic mode. This is illustrated in FIG. 2b by the non-linear curve of the absorption coefficient k at short wave lengths. However, higher absorption in the anti-reflection coating results in a reduction in the efficiency of the solar cell since part of the light absorbed is no longer available for obtaining charge carriers and is undesirable.

Methods are thus provided herein for a deposition process by means of which it is possible to deposit reactive films stably, reliably and such that they can be easily modified, in particular with short process times.

Processes by means of which the partial pressure of the reactive gas can be held as constant as possible during all phases of the process are disclosed. This may be achieved by means of an adjusted reactive gas flow while the coating process is switched off, i.e. when the system status is idle.

The effective flow of the reactive gas into the process chamber is therefore reduced during the idle phase (plasma OFF) such that the partial pressure of the reactive in the start phase corresponds to that during the rest of the plasma process. The term 'idle flow correction' (IFC) has been chosen to describe this type of gas control.

Optionally, a wait time can be added between the switch from idle gas control to process gas control and the switching on of the plasma (power ON). This gives an additional parameter which can be used to achieve constant partial pressure of the reactive gas depending on the transient behaviour of the system.

The effective gas flow into the chamber can be reduced in several ways:

In a first embodiment the gas flow controller set-point used in the idle phase is lower than the process set-point. Here the partial pressure of the reactive gas during start phase is a function of the idle set-point, the time delay, the so-called wait time and the control behaviour of the gas flow controller.

Figure 4:
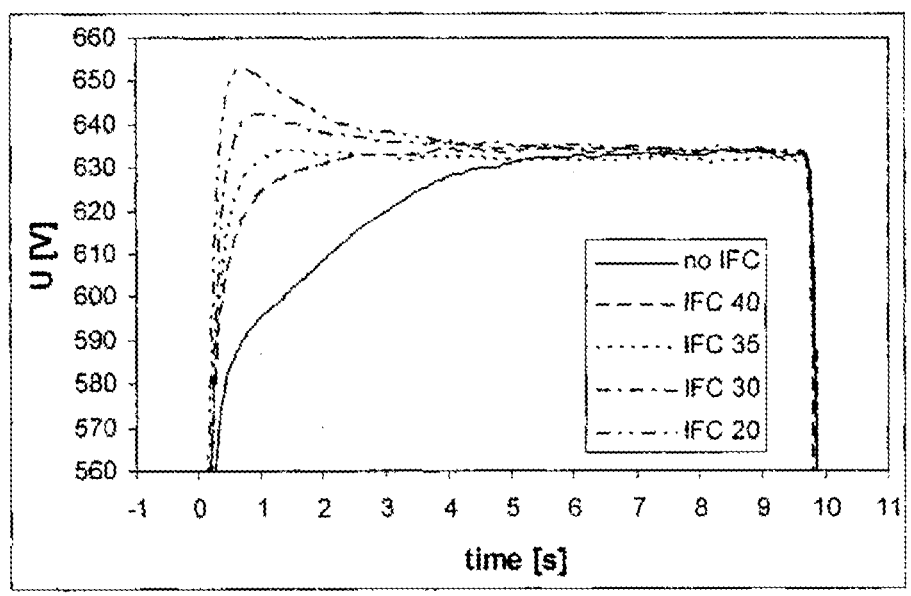
FIG. 4 illustrates the sputtering voltage curve during reactive sputtering of Si with 40 sccm Ar and 47.5 sccm $N_2$ during the process for various settings of the $N_2$ idle gas flow and with a wait time of 0 s.

FIG. 4 illustrates the sputtering voltage curve for a reactive SiN deposition process from the Si target in the sensitive transition range for various idle flow values with 40 sccm Ar and 47.5 sccm $N_2$ during the process for various $N_2$ idle gas flow settings and a wait time of 0 s. In this case, 'no IFC' corresponds to a constant set point of 47.5 sccm for the $N_2$ gas flow controller and results in the voltage curve illustrated in FIG. 1. FIG. 1 illustrates that a very stable sputtering voltage can be achieved for approx. 35 sccm idle flow, indicating a homogeneous $N_2$ partial pressure throughout the entire course of the process.

Figure 5A:
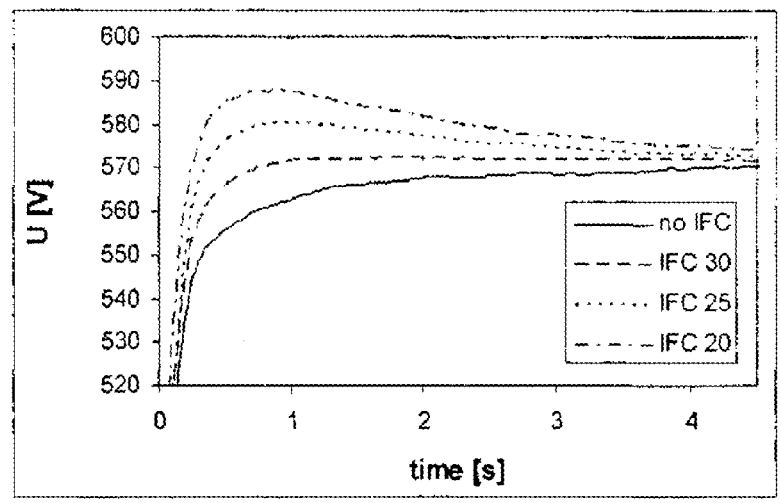
FIG. 5a illustrates the sputtering voltage curve during reactive sputtering of Si with 55 sccm Ar and 35 sccm $N_2$ during the process for various settings of the $N_2$ idle gas flow.
Figure 5B:
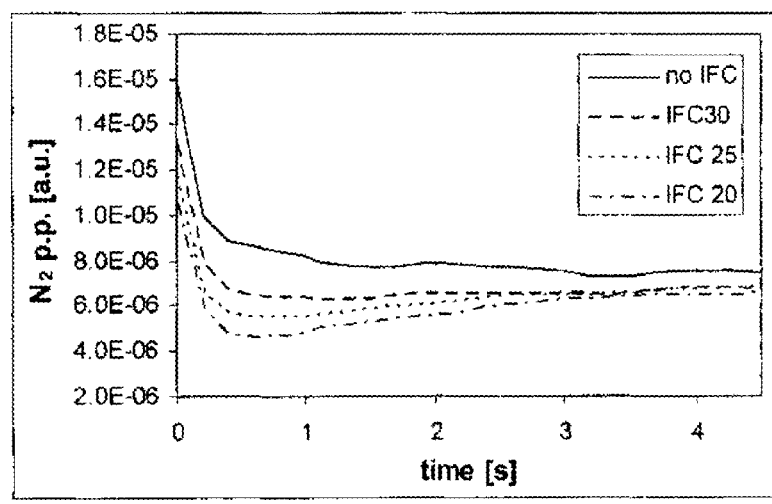
FIG. 5b illustrates the nitrogen partial pressure curve (RGA measurement) during reactive sputtering of Si with 55 sccm Ar and 35 sccm $N_2$ during the process for various settings of the $N_2$ idle gas flow.

Measurements taken with a residual gas analyzer (RGA) confirm the correlation between sputtering voltage and the partial pressure of the reactive nitrogen, as illustrated in FIG. 5. Whilst without IFC, i.e. a constant nitrogen flow of in this case 35 sccm including during idle phase, at the start of the process at t=0 s a higher nitrogen partial pressure prevails, at 30 sccm idle flow there is a constant partial flow after only approx. 0.75 s, associated with a constant sputtering voltage for these process settings. When the idle flow is reduced more strongly, reduced partial pressure is observed at the start of the sputtering process and this is reflected by an increased sputtering voltage.

Figure 6:
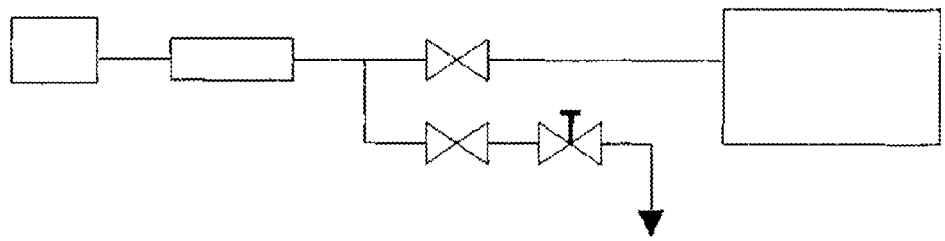
FIG. 6 illustrates the principle of a gas feed with variable vent line (needle valve) cross section for generating the desired gas transient behaviour.

Further embodiments are based on circuit design options which direct the reactive gas, or a part of the reactive gas, not into the process chamber but, for example, directly into the pre-vacuum line, which may also be called a purge line, during the idle phase, as illustrated schematically in FIG. 6. An arrangement such as that disclosed in WO 2008/080249 A2, which is incorporated herein by reference in its entirety, can also be used.

Figure 7:
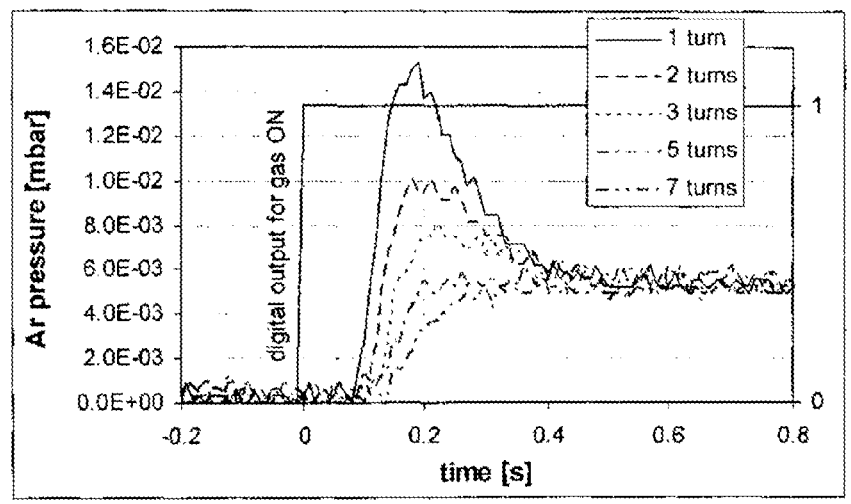
FIG. 7 illustrates gas pressure over time for various needle valve settings (number of revolutions counter clockwise, 0 means valve completely closed).

This approach enables the mass flow controller (MFC) to be operated with a constant set point and the process is therefore no longer dependent on the transient behaviour of the gas flow controller which might under certain circumstances adversely effect the desired accuracy or reproducibility. Furthermore, as described in WO 2008/080249 A2, it is possible to set the transient behaviour of the gas pressure with great accuracy using a controllable effective suction power in the purge line as illustrated in FIGS. 6 to 7.

Figure 8:
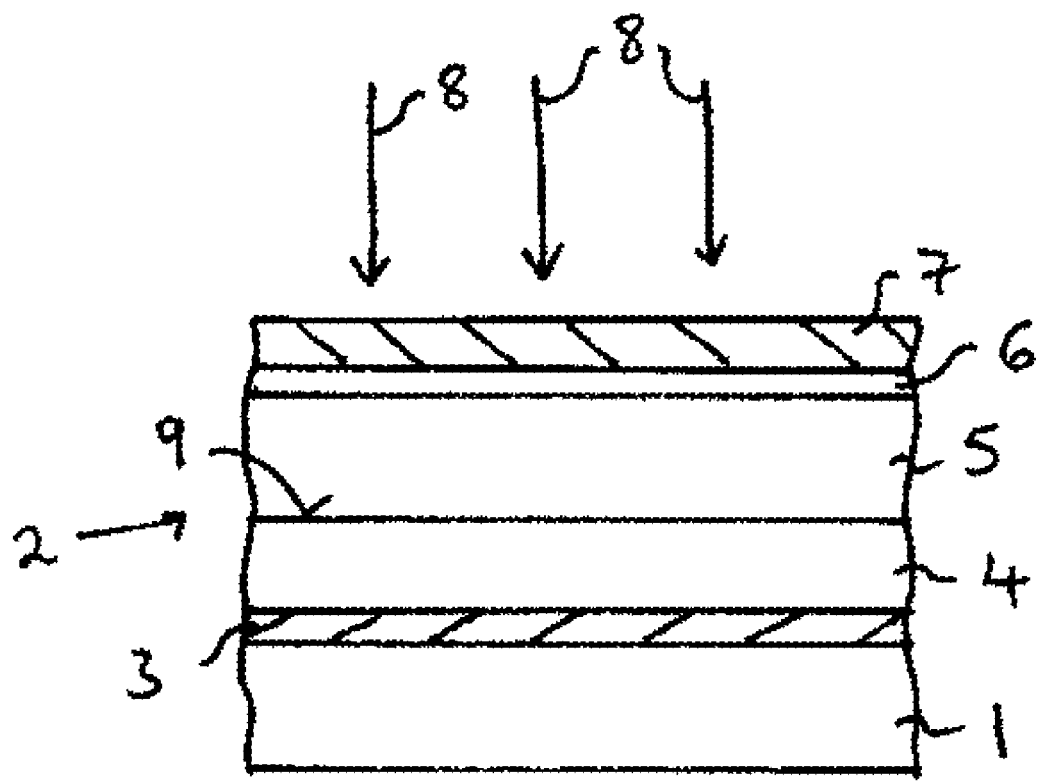
FIG. 8 illustrates a schematic representation of a solar cell with an anti-reflection film.

FIG. 8 illustrates a schematic representation of a cross section of a substrate 1. The substrate 1 provided is in the form of a wafer comprising a plurality of solar cell structures 2. The wafer may be a silicon wafer. The solar cell structure comprises a first electrically conductive layer 3 which is positioned on the substrate 1 and forms a first electrode, a p-doped silicon layer 4 which is positioned on the first electrode 3, an n-doped amorphous silicon layer 5 which is positioned on the p-doped amorphous silicon layer, an anti-reflection film 6 which in this embodiment is positioned on the p-doped amorphous silicon layer, and a second electrode 7 which consists of a transparent electrically conducting layer such as indium tin oxide (ITO).

Sunlight, represented graphically by the arrows 8, hits the second electrode 7 and shines through the second electrode 7 and the anti-reflection film 6, the photons being converted into electrical energy at the p-n junction 9 between the two amorphous silicon layers 5, 6.

Figure 9:
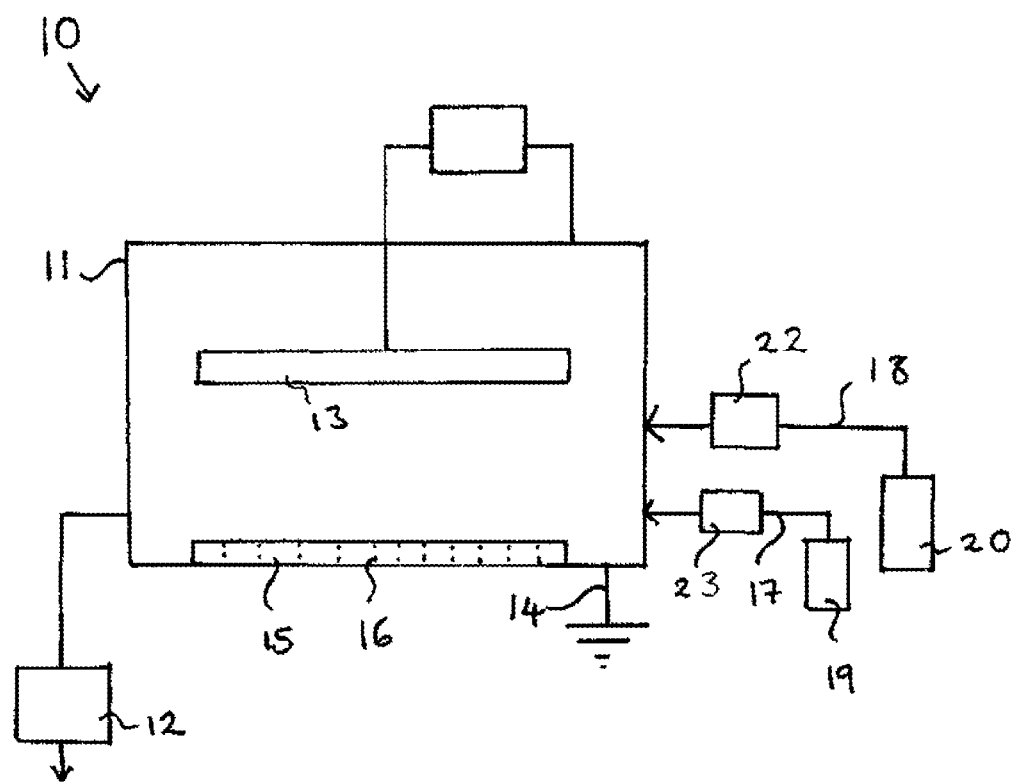
FIG. 9 illustrates a system for the reactive sputtering of an anti-reflection film in accordance with a first embodiment.

FIG. 9 illustrates a system 10 in accordance with a first embodiment which can be used to produce an anti-reflection film on a wafer comprising a plurality of solar cells as illustrated in FIG. 8.

The system 10 comprises a vacuum chamber 11 which can be pumped out with a pump 12 such as a turbo molecular pump. The device 10 has a target 13 including silicon. A voltage can be applied between the target 13 and ground 14 thereby forming a plasma near to the surface of the target 13 in the vacuum chamber 11. The high energy ions of the plasma physically release material from the target 13 which is deposited on a substrate 15 in order to produce a film on the substrate 15. The substrate 15 is a wafer comprising a plurality of solar cell structures which are indicated schematically by means of the broken lines 16.

Also provided are two gas lines 17, 18 which in the process disclosed herein deliver different gasses to the vacuum chamber 11. A first gas line 17 is used for a noble gas 19 such as argon and the second gas line 18 is used for a reactive gas 20 such as nitrogen or a nitrogen-containing compound. In this context the term 'reactive gas' is used to mean a gas which reacts with the material released from the target 13 to deposit a film comprising the elements of the target 13 and the gas. The flow of the reactive gas 20 in the second gas line 18 can be set independently of the flow of the noble gas 19 in the first gas line 17 by a valve 22 such as a needle valve. The first gas line 17 also has a valve 23 by means of which the flow of the noble gas 19 can be adjusted.

The following process can be used with the system 10 illustrated in FIG. 9 to sputter an anti-reflection film 21 onto the substrate 15. The substrate 15 is positioned in the vacuum chamber 11 and the vacuum chamber 11 is pumped out using the pump 12. While the voltage between the target 13 and ground 14 is switched off, the partial pressure of the noble gas 19 and the reactive gas 20 in the vacuum chamber 11 is set by opening the valves 22, 23. The flow of the noble gas 19 can be approx. 40 sccm and the flow of the nitrogen 20 approx. 35 sccm, for example.

To start the deposition process, in one embodiment, the voltage is applied to the target 13 and the flow of nitrogen 20 is increased to 47.5 sccm almost simultaneously. The flow of the noble gas 19 is not changed and remains at 40 sccm.

In a further embodiment of the process a time delay is used between increasing the nitrogen flow and switching on the voltage.

In both embodiments, after the voltage is applied to the target, silicon is removed from the target, reacts with the nitrogen-containing atmosphere so that a film including both silicon and nitrogen, for example SiN, is deposited on the substrate.

Figure 10:
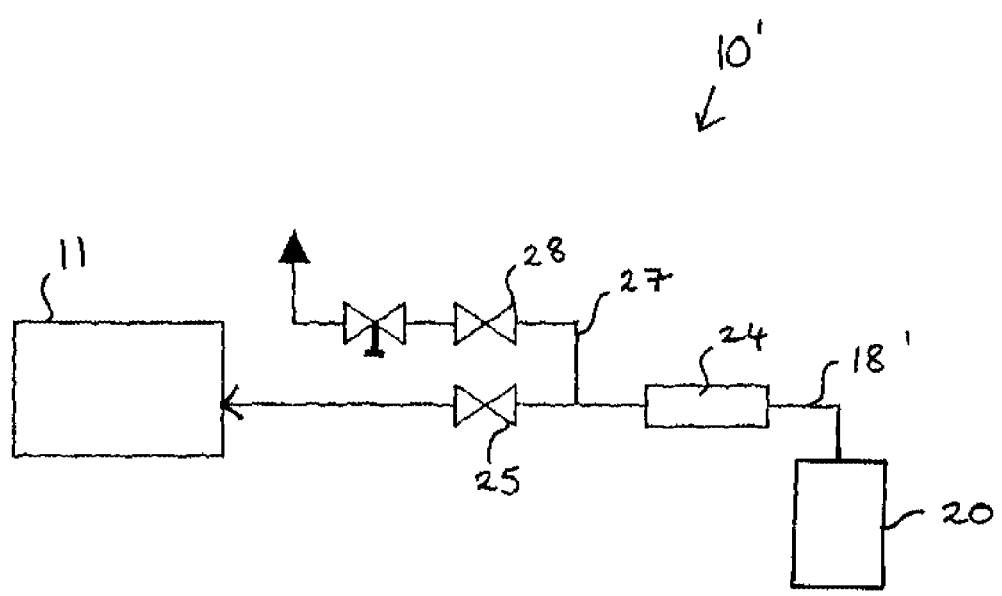
FIG. 10 illustrates a system for the reactive sputtering of an anti-reflection film in accordance with a second embodiment.

FIG. 10 illustrates a system 10' for the reactive sputtering of an anti-reflection film according to a second embodiment. In this embodiment the gas line 16' for the reactive gas 20 comprises a mass flow controller 24, a valve 25 and a vent line 27 which is positioned upstream of the mass flow controller 24 so that the reactive gas 20 can be vented from the gas line 18' after the mass flow controller 24 and before the valve 25. The vent line 27 also has a valve 28. A similar suitable arrangement is disclosed in WO 2008/080249 A2.

The portion of the flow of the reactive gas 20 through the gas line 18' and through the vent line 27 can thus be set by adjusting the two valves 25, 28, while the set-point of the mass flow controller 24 remains constant. This can prevent the transient behaviour of the gas flow from adversely affecting the accuracy or the reproducibility of the of the sputtering process.

Anti-reflection films for solar cells can be deposited using various deposition processes. Herein, a reactive sputtering process is used to deposit an anti-reflection film of silicon nitride (SiN) or a silicon nitride based material. This anti-reflection film can be produced for wafer-based monocrystalline and polycrystalline solar cells in a single substrate system with a high throughput.

Gas flows, in particular the flow of the nitrogen-containing reactive gas, are thus controlled in order to deposit an anti-reflection film reliably on the substrate. Every effort is made to ensure that the partial pressure of the nitrogen-containing reactive gas is similar both before the start of deposition and during deposition.

During the deposition process a portion of the nitrogen-containing reactive gas is bound into the deposited film. As a result, the partial pressure of the nitrogen-containing reactive gas in the vacuum chamber after the voltage has been switched on is lower than the partial pressure in the vacuum chamber prior to switching on the voltage. This drop in the partial pressure is compensated by controlling the flow of the nitrogen-containing gas and, in particular, by the lower value of the flow prior to the start of deposition and the increase of the flow during the deposition process.

The application discloses control of gas, or gases in sputtering processes, also known as vacuum cathode sputtering and, in particular, to the control of reactive gases in reactive sputtering processes. The gas control methods described herein may be used for sputtering processes with short process times in which the length of the start phase described below represents a significant portion of the process time. These sputtering processes can be used to produce thin anti-reflection films on solar cells.

Methods are provided herein for a deposition process by means of which it is possible to deposit reactive films stably, reliably and such that they can be easily modified, in particular with short process times.

Sputtering, or cathode sputtering, is a physical process in which atoms are released from a target, also referred to as the target, by bombardment with high energy ions, predominantly noble gas ions of a working gas, and transferred to the gas phase. The term sputtering is generally understood to mean only sputter deposition, a vacuum-based coating technique belonging to the group of PVD processes. The term 'physical vapour deposition', or PVD for short, refers to a group of vacuum-based coating processes and thin film technologies in which, in contrast to CVD processes, a film is formed directly by the condensation of a starting material vapour.

These processes are characterised by the following features among others: gas or vapour generation of the film-forming particles 'sputtering'; transport of the vapour to a substrate and condensation of the vapour onto the substrate and film formation.

Plasmas are frequently used in PVD processes to generate noble gas ions from a working gas such as argon. In these processes the plasma can be generated in the processing chamber itself (in situ) or separately, such as remote plasma sources.

Here reactive sputtering refers to a variant of the PVD process in which the sputtered atoms react with an additional reactive gas introduced into the space between target and substrate in the transport phase or during condensation.

The flow of a non-reactive gas in the vacuum chamber can be set independently of the flow of the nitrogen-containing reactive gas. In one embodiment the flow of a non-reactive gas is almost about the same when the voltage between the target and ground is switched off and when it is applied.

In this embodiment the partial pressure of the reactive gas in the vacuum chamber can only be adjusted by setting the flow of reactive gas. This simplifies the control of the partial pressure of the reactive gas in the various steps of the process.

The step in which the voltage between the target and ground is switched off can be referred to as idle status while the step in which the voltage between the target and ground is applied can be referred to as the sputtering step.

Between the step in which the voltage between the target and ground is switched off and the step in which the voltage between the target and ground is applied the flow of the nitrogen-containing reactive gas can be controlled such that the partial pressure of the nitrogen-containing reactive gas in the vacuum chamber fluctuates by less than 10%.

This process can be used to compensate for the differing rates at which nitrogen is removed from the atmosphere in the vacuum chamber and bound into the deposited film.

To summarize, a method for the deposition of a anti-reflection film on a substrate includes the following. A substrate including a plurality of solar cell structures is provided and placed in a vacuum chamber. The vacuum chamber includes a target which includes silicon. Whilst the voltage between the target and ground is switched off, a flow of a nitrogen-containing reactive gas in the vacuum chamber is set to a first value. The flow of the nitrogen-containing reactive gas is then increased to a second value and a voltage is applied between the target and ground, whereby a film comprising silicon and nitrogen is deposited on the substrate in a flow of the nitrogen-containing reactive gas which is greater than the first value. The value of the flow of the nitrogen-containing gas during deposition of the film may be about the same as the second value or may be slightly less than the second value.

In further embodiments the difference between the first value and the second value of the flow of the nitrogen-containing gas is set so as to achieve a more stable sputtering process within a shorter time. This is advantageous when the deposition process is very short because, for example, a very thin film is desired.

In one embodiment the difference between the first value and the second value of the flow of the nitrogen-containing gas is set such that the partial pressure of the nitrogen-containing reactive gas is stable within 1 second of the voltage between the target and ground being applied.

In a further embodiment the difference between the first value and the second value of the flow of the nitrogen-containing gas is set so that the voltage is stable within 1 second of the voltage between the target and ground being applied.

The difference between the first value and the second value of the flow of the nitrogen-containing gas can be set such that the deposition rate of the anti-reflection film is stable within 1 second of the voltage between the target and ground being applied.

Stable is used to denote a value which is within 10% or within 5% or within 1% of the value of the parameter at the end of the sputter deposition process.

Pure nitrogen or a nitrogen compound can be used as the nitrogen-containing reactive gas.

The process can be used to deposit an anti-reflection film of SiN on different types of solar cells. For example, the substrate can be a wafer with a plurality of monocrystalline or polycrystalline solar cells. The substrate may be a silicon wafer.

At the start of the deposition process after idle status it is possible to apply the voltage between the target and ground and increase the flow of the nitrogen-containing reactive gas approximately simultaneously. Alternatively, the voltage between the target and ground can be applied with a time delay after the flow of the nitrogen-containing reactive gas has been increased.

The flow of the nitrogen-containing reactive gas can be controlled by adjusting a needle valve positioned in the gas line from the gas source to the vacuum chamber.

In a further embodiment a mass flow controller is used to adjust the flow of the nitrogen-containing reactive gas. The set-point of the mass flow controller may be controlled so that the partial pressure of the nitrogen-containing gas is about the same when the voltage between the target and ground is switched off and when the voltage between the target and ground is applied.

If a mass flow controller is provided the gas flow of the nitrogen-containing reactive gas in the vacuum chamber can be adjusted by directing a portion of the reactive nitrogen-containing gas flow into a vent line that is positioned downstream of the mass flow controller and upstream of the vacuum chamber. In this embodiment the set-point of the mass flow controller is about the same when the voltage between the target and ground is switched off and when the voltage between the target and ground is applied. By directing a portion of the flow of the nitrogen-containing gas into the vent line, the partial pressure of the reactive gas can be controlled so that it is about the same when the voltage between the target and ground is switched off and when the voltage between the target and ground is applied without adjusting the set-point of the mass flow controller.

WO 2008/030249 A2 discloses a system for sputtering in which the gas flow in the vacuum chamber can be adjusted better with a mass flow controller since the mass flow controller can always be operated with a constant set-point and the process is therefore no longer dependent on the transient behaviour of the gas flow controller which might under certain circumstances adversely affect accuracy or reproducibility.

In summary, deposition conditions such as pressure are typically adjusted in order to be able to deposit films reliably with the desired properties. Typically, these conditions are different for different films in one single structure.

The invention having been thus described with reference to certain specific embodiments A and examples thereof, it will be understood that this is illustrative, and not limiting, of the appended claims.

The invention claimed is:

1. Method for the deposition of an anti-reflection film on a substrate comprising:
   providing a substrate comprising a plurality of solar cell structures,
   introducing the substrate in a vacuum chamber with a target comprising silicon,
   setting a flow of a nitrogen-containing reactive gas into the vacuum chamber to a first value whilst the voltage between the target and ground is switched off,
   increasing the flow of the nitrogen-containing reactive gas to a second value,
   applying a voltage between the target and ground,
   depositing an anti-reflection film comprising silicon and nitrogen on the substrate during a flow of the nitrogen-containing reactive gas having a value which is higher than the first value.

2. Method according to claim 1, wherein a flow of a non-reactive gas introduced into the vacuum chamber while the voltage between the target and ground is switched off and while the voltage between the target and ground is applied is almost the same.

3. Method according to claim 1, wherein a partial pressure of the nitrogen-containing reactive gas in the vacuum chamber fluctuates by less than 10% between a stage during which the voltage between the target and ground is switched off and a stage during which the voltage between the target and ground is applied.

4. Method according to claim 1, wherein the difference between the first value and the second value of the flow of the nitrogen-containing reactive gas is set such that a partial pressure of the nitrogen-containing reactive gas is stable within 1 second of the voltage between the target and ground being applied.

5. Method according to claim 1, wherein the difference between the first value and the second value of the flow of the nitrogen-containing gas is set such that the voltage is stable within 1 second of the voltage between the target and ground being applied.

6. Method according to claim 1, wherein the difference between the first value and the second value of the flow of the nitrogen-containing gas is set such that a deposition rate of the anti-reflection film is stable within 1 second of the voltage between the target and ground being applied.

7. Method according to claim 1, wherein pure nitrogen or a nitrogen compound is used as the nitrogen-containing reactive gas.

8. Method according to claim 1, wherein a wafer comprises a plurality of monocrystalline or polycrystalline solar cells is used as the substrate.

9. Method according to claim 1, wherein the voltage between the target and ground is applied with a time delay after the flow of the nitrogen-containing reactive gas has been increased.

10. Method according to claim 1, wherein the flow of the nitrogen-containing reactive gas is controlled by adjusting a needle valve.

11. Method according to claim 1, wherein a mass flow controller is used to adjust the flow of the nitrogen-containing reactive gas and a set-point of the mass flow controller is controlled so that a partial pressure of the nitrogen-containing gas is about the same when the voltage between the target and ground is switched off and when the voltage between the target and ground is applied.

12. Method according to claim 11, wherein the flow of the nitrogen-containing reactive gas into the vacuum chamber is adjusted by directing at least a portion of the flow of the nitrogen-containing gas into a vent line that is positioned downstream of the mass flow controller and upstream of the vacuum chamber.

13. Method according to claim 12, wherein the set-point of the mass flow controller remains about the same and the flow of the nitrogen-containing reactive gas into the vacuum chamber is adjusted by directing at least a portion of the flow of the nitrogen-containing gas into a vent line that is positioned downstream of the mass flow controller and upstream of the vacuum chamber, the partial pressure of the nitrogen-containing reactive gas remaining about the same when the voltage between the target and ground is switched off and when the voltage between the target and ground is applied.

* * * * *